United States Patent
Lips et al.

(10) Patent No.: US 11,796,614 B2
(45) Date of Patent: Oct. 24, 2023

(54) RADIO FREQUENCY (RF) ANTENNA ELEMENT WITH AN OPTICAL BACK-END

(71) Applicant: KONINKLIJKE PHILIPS N.V., Eindhoven (NL)

(72) Inventors: Oliver Lips, Hamburg (DE); Martinus Bernardus Van Der Mark, Hamburg (DE)

(73) Assignee: Koninklijke Philips N.V., Eindhoven (NL)

(*) Notice: Subject to any disclaimer, the term of this patent is extended or adjusted under 35 U.S.C. 154(b) by 601 days.

(21) Appl. No.: 17/042,368

(22) PCT Filed: Mar. 25, 2019

(86) PCT No.: PCT/EP2019/057418
§ 371 (c)(1),
(2) Date: Sep. 28, 2020

(87) PCT Pub. No.: WO2019/185536
PCT Pub. Date: Oct. 3, 2019

(65) Prior Publication Data
US 2021/0025955 A1    Jan. 28, 2021

(30) Foreign Application Priority Data
Mar. 29, 2018   (EP) ..................... 18164927

(51) Int. Cl.
*G01R 33/36* (2006.01)
*H01Q 7/00* (2006.01)

(52) U.S. Cl.
CPC ..... *G01R 33/3692* (2013.01); *G01R 33/3621* (2013.01); *H01Q 7/00* (2013.01)

(58) Field of Classification Search
CPC ... G01R 33/3621; G01R 33/3692; H01Q 7/00
See application file for complete search history.

(56) References Cited

U.S. PATENT DOCUMENTS

| 5,545,999 A | 8/1996 | Mueller et al. |
| 6,575,965 B1 | 6/2003 | Fitch et al. |

(Continued)

FOREIGN PATENT DOCUMENTS

CN    203433101 U    8/2013

OTHER PUBLICATIONS

International Search Report and Written Opinion from PCT/EP2019/057418 dated Jun. 28, 2019.

(Continued)

*Primary Examiner* — Gregory H Curran

(57) ABSTRACT

A radio frequency (RF) antenna arrangement comprising an RF antenna element and an optical back-end. The RF antenna element comprises an electrically conductive loop, an electronic pre-amplifier and a photo-electrical conversion element. The optical back-end comprising an optical power source and a photodetector. The RF antenna element and the optical back-end being optically coupled, and wherein the optical power source is optically coupled to the photo-electrical conversion element. The photo-electrical conversion element generates upon incidence of optical power from the optical power source an electrical power signal to the pre-amplifier. The photo-electrical conversion element generates optical data signals from electrical data signals picked-up by the electrically conductive loop. The photo-electrical conversion element applies the optical data signals to the photodetector.

5 Claims, 1 Drawing Sheet

(56) References Cited

U.S. PATENT DOCUMENTS

| | | | |
|---|---|---|---|
| 8,636,980 B2 | 1/2014 | Elgort et al. | |
| 8,847,598 B2 * | 9/2014 | Hardy | G16H 40/67 |
| | | | 324/318 |
| 9,444,000 B2 | 9/2016 | Akihiko et al. | |
| 10,481,228 B2 * | 11/2019 | Van Helvoort | G01R 33/3415 |
| 2004/0019273 A1 | 1/2004 | Helfer et al. | |
| 2006/0066311 A1 | 3/2006 | Koste et al. | |
| 2007/0164746 A1 | 7/2007 | Jevtic et al. | |
| 2013/0106537 A1 * | 5/2013 | Biber | G01R 33/3621 |
| | | | 333/239 |
| 2015/0335231 A1 | 11/2015 | van der Mark et al. | |
| 2016/0061916 A1 | 3/2016 | Duensing | |

OTHER PUBLICATIONS

S. Fandrey, S. Weiss, J. Müuller, Development of an active intravascular MR-device with an optical Transmission System, IEEE Transactions on Medical Imaging, vol. 27, Issue 12, Dec. 2008 pp. 1723-1727.

Van der Mark et al. "All Optical Power and Data Transfer in Catheters using an Efficient LED" Proc. SPIE 9317, Optical Fibers and Sensors for Medical Diagnostics and Treatment Applications Proceedings of SPIE vol. 9317 (Mar. 11, 2015); doi:10.1117/12.2076044.

Omer Gokalp Memis et al. "Miniaturized Fiber-Optic Transmission System for MRI Signals" Magnetic Resonance in Med. vol. 59 p. 165-173 (2008).

Natalia Gudino et al., "Optically Controlled Switch-Mode Current-Source Amplifiers for On-Coil Implementation in High-Field Parallel Transmission" Magnetic Resonance in Medicine vol. 76 p. 340-349 (2016).

* cited by examiner

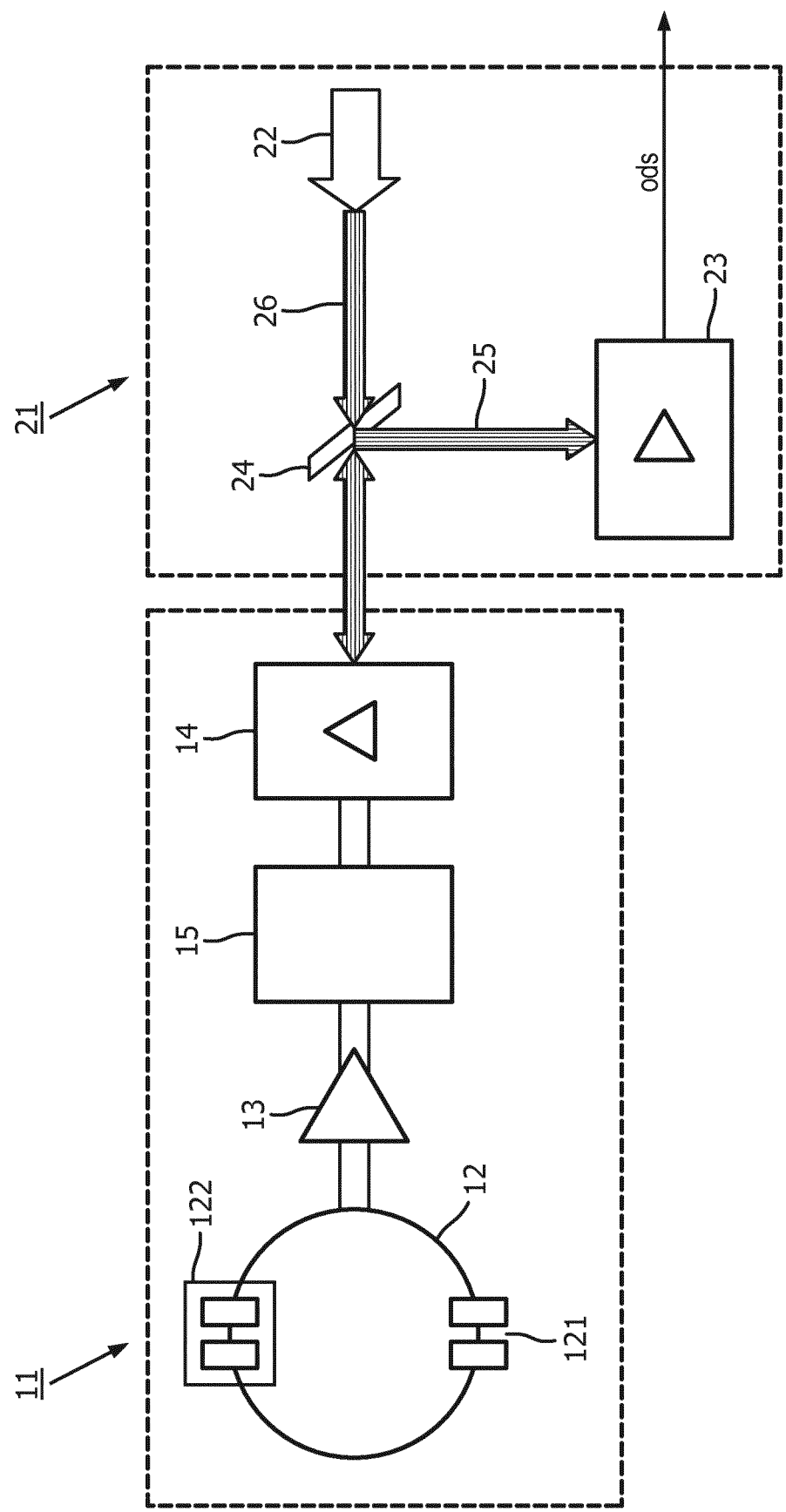

RADIO FREQUENCY (RF) ANTENNA ELEMENT WITH AN OPTICAL BACK-END

CROSS REFERENCE TO RELATED APPLICATIONS

This application is a U.S. national phase application of International Application No. PCT/EP2019/057418 filed Mar. 25, 2019, which claims the benefit of EP Application Serial No. 18164927.8 filed on Mar. 29, 2018 and is incorporated herein by reference.

FIELD OF THE INVENTION

The radio frequency (RF) antenna element with an optical back-end is provided for use in an magnetic resonance examination system to pick-up magnetic resonance signals.

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field $B_0$ whose direction at the same time defines an axis (normally the z-axis) of the co-ordinate system to which the measurement is related. The magnetic field $B_0$ causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z-direction relaxes with a second and shorter time constant $T_2$ (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, magnetic field gradients extending along the three main axes are superposed on the uniform magnetic field $B_0$, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo.

BACKGROUND OF THE INVENTION

A radio frequency (RF) antenna element with an optical back-end is known from the US-patent application US2007/0164746.

The known RF antenna element includes a local coil and a pre-amplifier. The known RF antenna element is provided with an optical interface circuitry. This optical interface circuitry forms an optical back-end. The pre-amplifier has its output coupled to a laser diode in the optical interface circuitry to generate a light signal that is propagated along an optical fibre. The optical interface circuitry further includes a photocell. The photocell receives an optical signal from the laser diode when the loop antenna must be decoupled. The optical interface circuitry's photocell is electrically connected to active decoupling circuitry coupled to the loop antenna. The optical interface circuitry includes a further photocell to receive optical power and convert into electrical power applied to the pre-amplifier.

SUMMARY OF THE INVENTION

An object of the invention is to provide an RF antenna element with an optical back-end that has a simpler circuit arrangement.

This object is achieved by the RF antenna element comprising an RF antenna element and an optical back-end, the RF antenna element comprising an electrically conductive loop, an electronic pre-amplifier and a photo-electrical conversion element, the optical back-end comprising an optical power source and a photodetector the RF antenna element and the optical back-end being optically coupled, and wherein the optical power source is optically coupled to the photo-electrical conversion element the photo-electrical conversion element generates upon incidence of optical power from the optical power source an electrical power signal to the pre-amplifier and the photo-electrical conversion element generates optical data signals from electrical data signals picked-up by the electrically conductive loop and the photo-electrical conversion element applies the optical data signals to the photodetector.

An insight of the present invention is to employ the photo-electrical conversion element for the optical-to-electrical conversion of the optical power signal into the electrical power signal for the pre-amplifier as well as for the electrical-to-optical conversion of the electronic data signal from the pre-amplifier into the optical data signal. More generally, the photo-electrical conversion element is arranged for both the conversion of optical power input into electrical power input as well as for the conversion of electronic data output into optical data output. Thus less optical-electrical conversion elements are required, notably at the RF side of the arrangement of the RF antenna element. The invention enables to provide the pre-amplifier with electrical power from an optical source and to receive the measured magnetic resonance signals by induced photoluminescence. This reduces the need for electrical, notably galvanic, connections to the RF amplifier element. This approach is advantageous when the RF antenna element is incorporated in an interventional instrument, such as a catheter, because there is no need for an electrical connection to the distal end of the instrument. Further, the approach of the invention is advantageous in an RF antenna arrangement having an array of a plurality of RF antenna elements. Then the invention avoids the need for intricate routing of a large number of electrical, notably galvanic connections. In both implementations the risk of unwanted RF resonances in electrically conductive cabling is reduced, because optical links are employed instead.

These and other aspects of the invention will be further elaborated with reference to the embodiments defined in the dependent Claims.

In an embodiment of the RF antenna element with an optical back-end, a photo-electrical conversion element with a high-bidirectional conversion efficiency is employed. This achieves good conversion efficiencies in both the optical to electrical direction as well as in the electrical to optical direction. The photo-electrical conversion element is preferably (an array of) GaN based semiconductor(s). Such photo-electrical conversion element a conversion efficiency of slightly above 40% for the photovoltaic conversion as well as the electro luminescence, which resulted in relatively high 18% bidirectional efficiency.

In a further embodiment of the invention, an electrical interface circuit is provided in series between the pre-amplifier and the photo-electrical conversion element. The electrical interface circuitry may function to match the impedance of the photo-electrical conversion element to the pre-amplifier, to provide an effective load to the pre-amplifier, e.g. of 50Ω, at which the efficiency of the pre-amplifier is optimal and electrical reflection to the pre-amplifier is minimised. The interface circuit may also function to provide filtering functionality.

In a further embodiment of the invention, the optical backend includes an optical separator, in particular a dichroic mirror, arranged to guide the optical data signals from the photo-electrical conversion element to the photodetector and to guide optical power signals form the optical power source to the photo-electrical conversion element. The photo-electrical conversion from optical power signals into electrical power signals and reverse electrical data signals from electrical into optical data signals, may be at different optical wavelengths. The optical separator achieves that optical data signals are guided towards the photo detector and avoids that optical power signals could reach the photodetector, but are guided towards the photo-electrical element. Thus, optical interference is avoided. Also more efficient use of the optical (power and data) signals is made. The dichroic mirror or dichroic beam splitter achieves near complete separation of the transmitted and reflected optical signals. This further avoids crosstalk between optical signals. Alternatively, a conventional 50/50 beamsplitter or a polarising beam splitter may be employed, which, however comes with a loss of optical signal in both transmission and reflection. Further alternatives for the optical separator may be to employ a diffraction grating or a Fresnel-like 45° beamsplitter.

These and other aspects of the invention will be elucidated with reference to the embodiments described hereinafter and with reference to the accompanying drawing wherein

BRIEF DESCRIPTION OF THE DRAWINGS

FIG. 1 shows a diagrammatic representation of an embodiment of the RF antenna arrangement of the invention.

DETAILED DESCRIPTION OF THE EMBODIMENTS

FIG. 1 shows a diagrammatic representation of an embodiment of the RF antenna arrangement of the invention. The RF antenna arrangement includes the RF antenna element 11 and the optical back-end 21. The RF antenna element includes an electrically conductive coil loop 12 that includes one or more capacitances 121 and a detuning circuit 122. the capacitances 121 and the detuning circuit 122 cooperate in that the electrically conductive loop may be switched to be resonant in the Larmor frequency band to acquire magnetic resonance signals and the electrically conductive loop may be switched (by the detuning circuit) to be non-resonant, so that the electrically conductive coil loop does not generate a voltage due to e.g. a strong RF excitation field. A pre-amplifier 13 is coupled to the electrically conductive loop to amplify the output voltage of the electrically conductive coil loop 12. The photo-electrical conversion element 14 is circuited in series with the pre-amplifier and amplifies the output voltage of the electrically conductive loop. The photo-electrical conversion element 14 converts the pre-amplifier's amplified voltage into an optical data signal. The optical data signal is applied to the optical back-end 21 by way of an optical link 25, defined as a first optical link, to a photodetector which converts the optical data signal back into an electronic output signal that is output to a signal processor and/or a reconstructor to reconstruct a magnetic resonance image from the acquired magnetic resonance signals, represented by the output voltages of the electrically conductive loop.

The pre-amplifier 13 is powered by the optical power source 22 of the optical back-end 21. The optical power source 22 is coupled to the photo-electrical conversion element 14 of the RF antenna element 11 via an optical link 26, defined as a second optical link. The optical power incident onto the photo-electrical conversion element 14 is converted into electrical power that is applied to the pre-amplifier 13.

According to the invention, the optical links 25 and 26 between the photo-electrical conversion element 14 and the photodetector 23 and between the optical power source 22 and the photo-electrical conversion element partly coincide. An optical separator, formed here by a dichroic mirror 24, splits the optical path of the optical data signal from the photo-electrical conversion element 14 to the photo detector and the optical power signal from the optical power source 5 to the photo-electrical conversion element. The portion of the optical paths 25 26 between the dichroic mirror 24 and the photo-electrical conversion element 14 run in common. That is, the dichroic mirror separates the optical data signals form the RF antenna element from the optical power signal from the optical power source. To that end, the photo-electrical conversion element may operate at a longer wavelength (e.g. 450 nm) than the optical power source ((405 nm).

The photo-electrical conversion element may be a GaN based semiconductor such as a blue (GaInN) LED or a blue GaN/InGaN semiconductor laser. The photo-electrical conversion element has a high bi-directional conversion efficiency, i.e. high efficiency for both photovoltaic conversion as well as for electroluminescence. By photo induced electroluminescence the photo-electrical conversion element emits light into the optical link 25 which is modulated by the load variations caused by the pre-amplifier. A semiconductor laser may have the required bandwidth and electrical current characteristics. For MR imaging typically 1.5 MHz of bandwidth are used, but also several hundred kHz are sufficient in many cases. The desired electrical current may be of the order tens to a few hundred mA.

An interface circuit 15 is provided between the pre-amplifier 13 and the photo-sensitive conversion element 14. The interface circuit 15 is comprises an arrangement of capacitances and inductances to match the impedance of the impedance of the photo-sensitive conversion element to the load for the pre-amplifier 13 (e.g. 50Ω). The interface circuit further may include filtering functions.

The optical source 22 of the optical back-end may be a semiconductor laser or an LED (e.g. operating at 405 nm)

The invention claimed is:

1. A radio frequency (RF) antenna arrangement comprising:
    an RF antenna element and an optical back-end,
        the RF antenna element including an electrically conductive loop, an electronic pre-amplifier and a photo-electrical conversion element, wherein the electronic pre-amplifier is coupled to the electrically conductive loop and is configured to amplify an output voltage of the electrically conductive loop, and wherein the photo-electrical conversion element is circuited in series with the pre-amplifier and is configured to convert the pre-amplifier's amplified voltage into an optical data signal;
    the optical back-end including an optical power source and a photodetector
    the RF antenna element and the optical back-end being optically coupled, and
    the photo-electrical conversion element is configured to apply the optical data signal to the photodector via a first optical link wherein
        the optical power source is optically coupled to the photo-electrical conversion element via a second optical link;
        the photo-electrical conversion element is configured to generate upon incidence of optical power from the optical power source an electrical power signal to the pre-amplifier and
        wherein the first optical link at least partly coincides with the second optical link.

2. The radio frequency (RF) antenna arrangement of claim 1, wherein the photo-electrical conversion element is formed by an array of GaN based semiconductor(s) with a high bidirectional conversion efficiency.

3. The radio frequency (RF) antenna arrangement of claim 1, wherein an electrical interface circuit is provided in series between the pre-amplifier and the photo-electrical conversion element.

4. The radio frequency (RF) antenna arrangement of claim 1, wherein
    the optical backend comprises an optical separator arranged
    to guide the optical data signals from the photo-electrical conversion element to the photodetector and
    to guide optical power signals from the optical power source to the photo-electrical conversion element.

5. The radio frequency (RF) antenna arrangement of claim 4, wherein the optical separator is dichroic mirror.

* * * * *